METHOD OF FORMING SEEDING SITES ON A SEMICONDUCTOR SUBSTRATE

Filed Dec. 5, 1968

INVENTOR

ISAMU KOBAYASHI

BY Hill, Sherman, Meroni, Gross & Simpson ATTORNEYS

United States Patent Office 3,692,574
Patented Sept. 19, 1972

3,692,574
METHOD OF FORMING SEEDING SITES ON A SEMICONDUCTOR SUBSTRATE

Isamu Kobayashi, Kanagawa-ken, Japan, assignor to Sony Corporation, Tokyo, Japan Filed Dec. 5, 1968, Ser. No. 781,542
Claims priority, application Japan, Dec. 12, 1967, 42/79,961
Int. Cl. B44d *1/18*
U.S. Cl. 117—212 10 Claims

ABSTRACT OF THE DISCLOSURE

Method for locating seeding sites on a semiconductor substrate for the subsequent growth of polycrystalline areas thereon which involves forming a masking layer over the substrate, depositing a semiconductor material in selected areas of the mask in which the seeding sites are to be developed, covering the resulting assembly with another masking layer, selectively removing portions of the second masking layer and thereafter selectively removing the remaining portions of the first masking layer, leaving seeding sites composed of a semiconductor material in the preselected locations.

CROSS REFERENCES TO RELATED APPLICATIONS

In previous applications, I have described various methods for selectively forming polycrystalline regions and single crystal regions on a single crystal semiconductor substrate by forming seeding sites on the substrate and then depositing and growing polycrystalline areas in the region above the seeding sites and single crystal areas in the remaining areas of the substrate by deposition of a semiconductor material from vaporous form and subsequent growth of semiconductor crystals. These techniques have been utilized in producing polycrystalline areas which serve as paths for impurity diffusion and as insulating means for isolating various portions of an integrated circuit as described more fully in my co-pending United States application Ser. No. 774,703 filed Nov. 12, 1968, now Pat. No. 361,617 and Ser. No. 774,702, filed Nov. 12, 1968.

BACKGROUND OF THE INVENTION

Field of the invention

This invention is in the field of applying seeding sites to the surface of a semiconductor substrate which involves successive application of masking layers with a semiconductor layer therebetween and selective removal of the masking layers to leave seeding sites composed of semiconductor material in preselected areas of the substrate.

Description of the prior art

Seeding sites for the growth of polycrystalline layers may be formed by selective deposition of compounds such as silicon dioxide, silicon nitride or sodium chloride on preselected areas of the substrate. Elements such as silicon, carbon, or germanium can also be used for this purpose. Another method consists in roughening the surface of the substrate at selected locations by sandblasting or by scratching the same to disturb the regularity of the lattice in the substrate. Still another method consists in selectively alloying an impurity such as aluminum, indium, gallium, antimony, phosphorus, arsenic or the like in those areas of the substrate in which the polycrystalline areas are to appear.

In some cases, it is desirable that the seeding sites be such as to permit the passage of an impurity therethrough quite readily. In this situation, where a silicon or germanium substrate is employed, it is desirable to vapor deposit a layer of the same material as the substrate for this purpose. In this case, however, since the seeding sites and the single crystal semiconductor substrate are composed of the same material, it is impossible to detect by visual means the formation of the seeding sites on the substrate at predetermined locations. Where the entire surface of the semiconductor substrate is coated with the silicon or germanium layer and this layer is selectively etched away to leave sites on the substrate, it is virtually impossible by visual observation to determine whether the seeding sites have been provided in the predetermined pattern desired because the seeding sites are then virtually indistinguishable from the underlying substrate. In this type of process, when the etching is continued a little longer so as to insure complete removal of the superfluous portions of the semiconductor layer, excessive etching is likely to occur which renders the upper surface of the substrate uneven. Accordingly, when a semiconductor layer is subsequently formed on the substrate by vapor growth processes, the resulting layer becomes uneven which then makes it difficult to properly secure electrodes onto the face of the device in the manufacture, for example, of an integrated circuit.

SUMMARY OF THE INVENTION

The present invention provides a method for providing seeding sites on a semiconductor substrate which are distinguishable from the underlying substrate, even though composed of the same semiconductor material so that selective etching can be carried out with much greater precision. In the process of the present invention, a semiconductor substrate is first provided with a masking layer, typically an oxide layer which is visually distinguishable from the underlying substrate. The masking layer is then provided with windows by selective etching in a pattern which defines the areas in which the seeding sites are to be located. Both the windows and the remaining masking layer are then provided with a layer of a vapor deposited semiconductor material which may be identical to that of the substrate. Following this, a second masking layer is applied over the resulting semiconductor layer. A process of selective etching is then carried out to remove those portions of the second masking layer which are adjacent the areas in which the seeding sites are to appear. This is followed by another etching operation in which the balance of the first masking layer and that portion of the second masking layer which overlies the seeding sites are removed. This leaves layers of the semiconductor material precisely in the areas in which the seeding sites are to be formed.

BRIEF DESCRIPTION OF THE DRAWINGS

FIG. 1A illustrates the substrate of the semiconductor starting material;

FIG. 1B illustrates the substrate after the formation of the first masking layer thereon;

FIG. 1C illustrates the manner in which windows are provided in preselected portions of the masking layer;

FIG. 1D illustrates the assembly after a semi-conductor layer has been deposited thereon;

FIG. 1E illustrates the assembly after a second masking layer has been applied over the semiconductor layer;

FIG. 1F illustrates the assembly after a selective etching operation in which predetermined portions of the second masking layer have been removed;

FIG. 1G illustrates the further step in the operation wherein the excess portions of the semiconductor layer have been removed;

FIG. 1H illustrates the condition in which the remainder of the two masking layers have been removed; and FIG. 1I illustrates the device after both a polycrystalline area and a single crystal area have been formed over the seeding sites and the substrate, respectively.

DESCRIPTION OF THE PREFERRED EMBODIMENTS

Figures 1A, 1B, 1C, 1D, 1E, 1F, 1G, 1H, 1I:
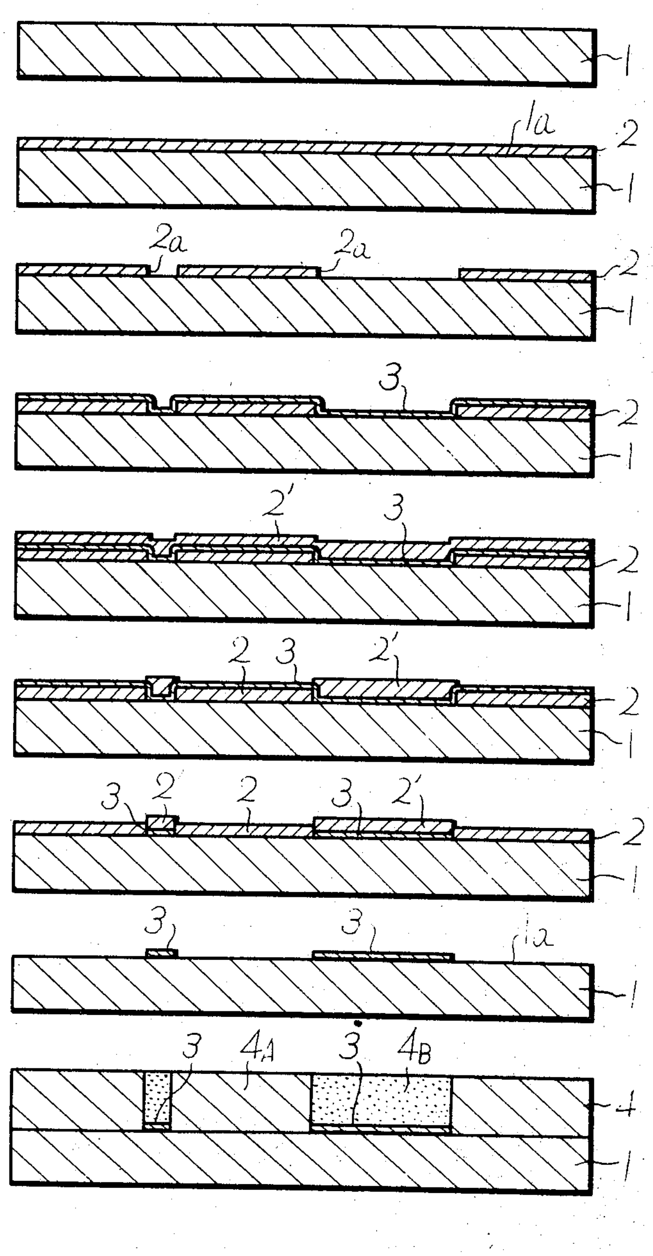
FIGS. 1A through 1I are greatly enlarged cross-sectional views illustrating rather schematically the steps involved in accordance with the process of the present invention.

As illustrated in FIG. 1A, a single crystal semiconductor substrate 1 consisting, for example, of silicon is first provided, and a surface 1a of the substrate is polished by suitable means to provide a mirror surface. Then, the surface 1a is entirely coated with an etching mask layer 2 which is illustrated in FIG. 1B of the drawings. The masking layer 2 may be formed by vapor deposition of silicon oxide, silicon nitride or the like, or by oxidation of the substrate. Typically, the thickness of the masking layer 2 is approximately 6000 angstroms.

The masking layer 2 is then selectively removed by the usual photoetching techniques to form windows 2a overlying those areas of the surface 1a of the substrate on which the seeding sites are to be ultimately formed. These photoetching techniques involve cotaing the surface with a photosensitive material, exposing the resulting photosensitive layer through an optical mask having the pattern desired, developing the resulting image by use of a suitable solvent, and finally by etching away the hardened portions of the exposed photosensitive layer to provide the windows 2a. In the case where the masking layer 2 is formed of silicon oxide, the etchant may be a solution composed of a mixture of 50% hydrofluoric acid and 100% ammonium fluoride, in a ratio of about 15 parts of the former to 100 parts of the latter by volume.

After the formation of the windows 2a, a semiconductor layer of silicon is vapor deposited to a thickness of 50 to 2,000 angstroms under vacuum conditions over an area including the area of the substrate exposed through the window 2a and, preferably, the entire remaining areas of the masking layer 2, as illustrated in FIG. 1D of the drawings. The semiconductor layers 3 ultimately serve as seeding sites for polycrystalline development as will be dscribed in a succeeding portion of this description.

The next step consists in covering the entire vapor deposited silicon layer 3 with a second etching mask layer 2′ similar to the layer 2 described in connection with FIG. 1B to produce a composite structure illustrated in FIG. 1E of the drawings.

The next step is to selectively etch away the masking layer 2′ to leave the oxide coating only on those areas which overlie the portions of the surface on which the seeding sites are to be formed. An etching mask having the same configuration as used to provide windows 2a in FIG. 1C can be used to accomplish this selective etching leaving a structure as shown in FIG. 1F in the drawings.

The next step involves removing those portions of the oxide layer 2′ which overlie the seeding sites to thereby expose the underlying silicon layers 3. If the vapor deposited layer is composed of silicon, the etchant may be a solution composed of one part by volume of a 50% hydrofluoric acid solution and 6 parts by volume of nitric acid in 70% solution.

The next step is to remove the residual oxide layers 2 and 2′ from about the silicon layers 3 as shown in FIG. 1H. The etchant in this case may be hydrofluoric acid. This can leave the seeding sites composed of the silicon layers 3 deposited at the preselected areas of the substrate.

In the final step, silicon is deposited by vapor deposition and growth techniques on the entire surface 1a of the semiconductor substrate 1. This results in the simultaneous formation of a single crystal semiconductor region 4A on the surface 1a of the substrate between the seeding sites and the polycrystalline regions 4B grown on the seeding sites 3, thereby providing a semiconductor layer 4 containing both single crystal and polycrystalline regions as illustrated in FIG. 1I.

The seeding site layers 3 are deposited in a thickness of from 50 to 2000 angstroms so that when the masking layer 2′ has been formed as illustrative in FIG. 1F, the masking layer 2′ and the underlying layer 2 are distinguishable from each other in subsequent processing.

In the process described, the selective deposition of the masking layer 2 on the substrate 1 at predetermined locations can be accurately ascertained by optical observation, since the masking layer 2 and the substrate 1 are formed of different materials. Similarly, in the portion of the process illustrated in FIG. 1F, selective formation of the masking layer 2′ can be similarly ascertained by optical observation since the masking layer 2′ and the seeding site layer 3 are composed of different materials. Furthermore, the use of the masking layer 2 with the windows 2a therein makes it possible to isolate the deposition of the layers 3 accurately onto the surface 1a of the substrate 1.

Although the present invention has been described in connection with an example where the substrate [1] is composed of silicon and a silicon layer [3] is vapor deposited thereon, it will be understood that similar results can be obtained by applying this invention to a situation where the seeding site layer [3] is formed of a material which has the same optical and chemical characteristics as the single crystal semiconductor substrate [1] or where the semiconductor substrate is formed, for example, of germanium and the seeding site layer 3 is also formed of this metal. In this case, the etchant for the seeding site may be composed of sodium hypochlorite.

It should be evident that many modifications and variations may be effected without departing from the scope of the novel concepts of the present invention.

I claim as my invention:

1. The method of providing precisely located seeding sites on a single crystal semiconductor substrate, forming a first mask over said substrate with windows therein where seeding sites are to be located, forming a coating thereon by vapor deposition of a seeding site material of the same material as said substrate covering said first mask and the window exposed portions of said substrate, forming a second mask over the entire surface of said seeding site material, removing all of said second mask except for those portions overlying the seeding site location, removing the portions of the seeding site material still exposed, removing all of the remaining portions of both said first mask and said second mask.

2. The method of providing seeding sites at precisely located areas on a semiconductor substrate of single crystal silicon which includes forming a first masking layer of silicon dioxide on said substrate, selectively etaching windows in said first masking layer over the area where seeding sites are to be formed, vapor depositing a layer of silicon over said masking layer and the portions of said substrate which are exposed through said windows thereby laying down a layer of silicon, forming a second silicon dioxide masking layer over said vapor deposited layer, selectively etching away said second oxide layer except for those portions covering the seeding sites, removing those portions of said vapor deposited layer not over the seeding sites, finally etching away the remaining portions of said first oxide layer as well as the remaining portions of said second oxide layer, whereby said single crystal silicon substrate is left with a silicon seeding site thereon.

3. The method of providing seeding sites at precisely located areas on a semiconductor substrate of single crystal silicon which includes forming a first masking layer of silicon dioxide on said substrate, selectively forming windows on said first masking layer where seeding sites are to be formed, vapor depositing a layer of silicon for said seeding sites over said first masking layer and over said substrate exposed through said windows, forming a second masking layer of silicon dioxide over said vapor deposited silicon layer, removing by an oxide soluble etchant said second masking layer except for those portions covering said seeding sites, removing by a vapor deposited silicon soluble etchant those portions of said silicon layer not over said seeding sites, and finally removing by an oxide soluble etchant the remaining portions of said first and second masks, said oxide soluble etchants having no effect on said vapor deposited silicon nor on said silicon substrate and said vapor deposited silicon soluble etchant having no effect on said silicon dioxide.

4. The method of providing precisely located seeding sites on a single crystal semiconductor substrate;

forming a first mask over said substrate with windows therein where seeding sites are to be located;

forming a coating thereon of a seeding site material covering said first mask and the window exposed portions of said substrate;

forming a second mask over the entire surface of said seeding site material;

removing all of said second mask except for those portions overlying the seeding site location;

removing the portions of the seeding site material still exposed;

removing all of the remaining portions of both said first mask and said second mask; and wherein said substrate and said coating of seeding site material are formed of germanium.

5. The method of providing precisely located seeding sites on a single crystal semiconductor substrate;

forming a first mask over said substrate with windows therein where seeding sites are to be located;

forming a coating thereon of a seeding site material covering said first mask and the window exposed portions of said substrate;

forming a second mask over the entire surface of said seeding site material;

removing all of said second mask except for those portions overlying the seeding site location;

removing the portions of the seeding site material still exposed;

removing all of the remaining portions of both said first mask and said second mask;

wherein said substrate is monocrystalline silicon; and wherein said seeding site material coating is formed by vapor deposition of silicon.

6. The method of claim 5 including the additional step of vapor depositing a layer of silicon over said substrate and said seeding sites.

7. The method of providing precisely located seeding sites on a single crystal semiconductor substrate, forming a first mask over said substrate with windows therein where seeding sites are to be located, forming a coating thereon of a seeding site material covering said first mask and the window exposed portions of said substrate, forming a second mask over the entire surface of said seeding site material, removing all of said second mask except for those portions overlying the seeding site location, removing the portions of the seeding site material still exposed, removing all of the remaining portions of both said first mask and said second mask.

8. The method of claim 7, in which said seeding site material coating is formed by deposition of semiconductor material from vaporous form.

9. The method of claim 7, in which said substrate is monocrystalline silicon.

10. The method of claim 9, in which said first and second masks are formed of an oxide of silicon.

References Cited

UNITED STATES PATENTS

| | | | |
|---|---|---|---|
| 3,326,729 | 6/1967 | Sigler | 117—212 X |
| 3,498,833 | 3/1970 | Lehrer | 117—5.5 X |
| 3,341,375 | 9/1967 | Hochberg et al. | 29—578 |
| 3,475,661 | 10/1969 | Iwata et al. | 317—234 |

ALFRED L. LEAVITT, Primary Examiner

C. K. WEIFFENBACH, Assistant Examiner

U.S. Cl. X.R.

117—5.5, 215; 156—11, 13, 17